United States Patent [19]

Younger

[11] Patent Number: 5,199,239
[45] Date of Patent: Apr. 6, 1993

[54] HOUSING SEAL INTERFACE

[75] Inventor: Edgar W. Younger, Plymouth, Minn.

[73] Assignee: Honeywell Inc., Minneapolis, Minn.

[21] Appl. No.: 767,581

[22] Filed: Sep. 30, 1991

[51] Int. Cl.$^5$ .............................................. B65D 43/04
[52] U.S. Cl. ...................................... 52/595; 52/584;
52/233; 403/274; 174/49; 220/4.21; 220/327
[58] Field of Search .................... 52/595, 584, 233;
403/274, 284, 312; 174/49; 220/4.21, 4.24, 327

[56] References Cited

U.S. PATENT DOCUMENTS

| | | |
|---|---|---|
| 3,403,713 | 10/1968 | Good et al. .................... 220/4.21 |
| 4,089,464 | 5/1978 | Teti, Jr. et al. . |
| 4,119,325 | 10/1978 | Oakley et al. . |
| 4,254,960 | 3/1981 | Jelinek . |
| 4,274,545 | 6/1981 | Peroni . |
| 4,452,365 | 6/1984 | Ascasibar-Verdejo . |
| 4,506,486 | 3/1985 | Culpepper, Jr. et al. ............ 52/529 |
| 4,508,569 | 4/1985 | Kumasaka et al. . |
| 4,854,476 | 8/1989 | Serio, Jr. ........................ 220/4.21 |

Primary Examiner—David A. Scherbel
Assistant Examiner—Wynn E. Wood
Attorney, Agent, or Firm—Edward Schwarz

[57] ABSTRACT

The joint between two nearly rigid, mating walls has a tongue on one wall's surface and a groove on the other wall's surface which have special cross section shapes cooperating to resist penetration of the joint by fluids such as water. At least one of the walls is formed of a plastic material which deforms under compressive loading. The shape of the tongue includes sides thereof which intersect the end to form corners defining the longitudinal edges of the tongue. The groove has walls which converge toward each other at the bottom of the groove from a mouth wider than the width of the end of the tongue. The shape of the groove forms a line of contact with each of the tongue's corners when the tongue is mated with the groove. During assembly, the corners of the tongue are forced into the walls of the groove by some type of clamping mechanism so as to at least slightly deform at least one of the tongue and groove.

12 Claims, 1 Drawing Sheet

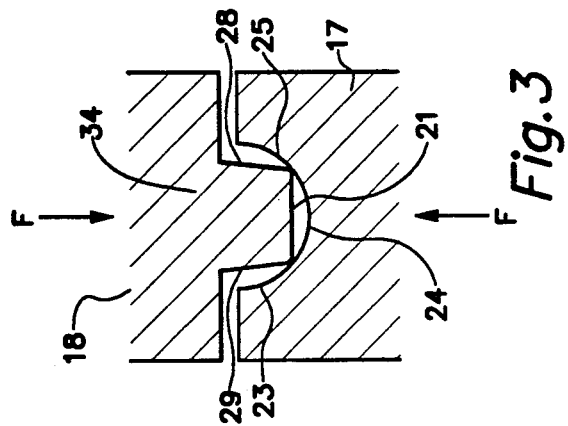
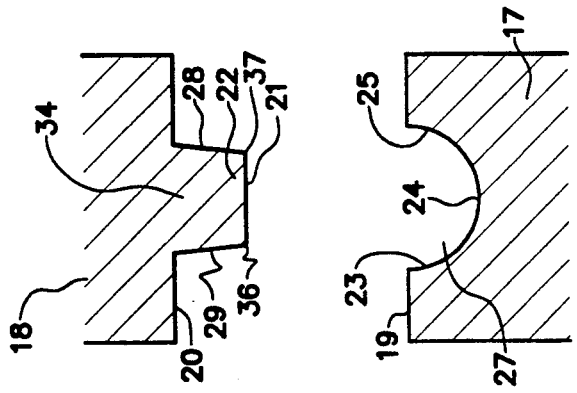
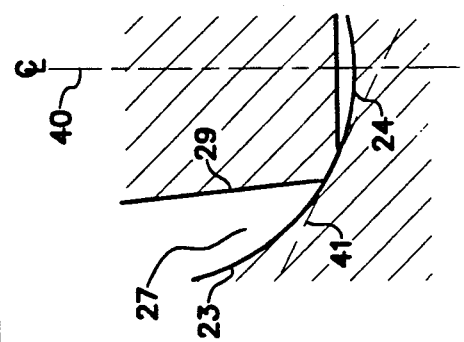
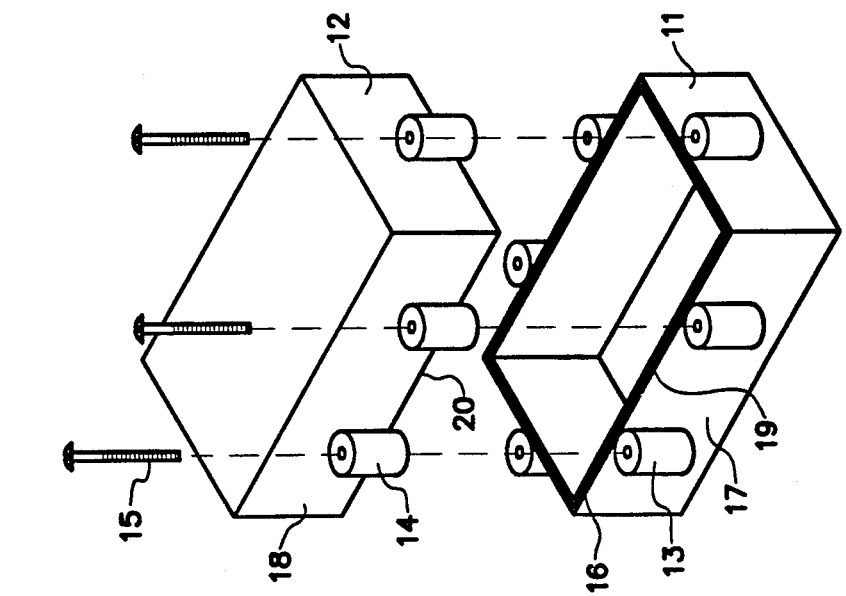

HOUSING SEAL INTERFACE

BACKGROUND OF THE INVENTION

It is frequently desirable to seal the joint between two walls or surfaces of an enclosure so as to prevent or resist penetration of the joint by fluids such as water. There are different types of exposure to fluids. In certain situations, the joint immersed in the fluid and there is positive pressure forcing the fluid against the joint to breach it. In other circumstances, the fluid is a liquid which merely wets the exterior of the walls involved and there is no positive pressure forcing the liquid into the joint. In this latter case, the presence of the liquid may result from condensation or rain.

This need to seal a joint to prevent its penetration by some fluid arises very frequently in the packaging of electronic equipment for use in a damp or wet environment for example. The problem has of course been solved successfully by the use of O-ring gaskets such as found in water resistant watch cases. It is also well known to use liquid caulks and sealants or flat gaskets to form this seal. But one can see that each of these solutions requires an additional element or material in order to effect the seal. This increases the cost and complexity of the assembly process. In addition, since the seal is formed within the joint itself, improper seating of the gasket can occur on occasion without any way available to detect this condition.

BRIEF DESCRIPTION OF THE INVENTION

An adequate interface for sealing abutting surfaces of first and second nearly rigid walls, at least one comprised of material which plastically deforms under load, comprises in the first wall and extending along at least a portion of the abutting surface a groove having an opening of predetermined width. The groove has an interior surface having opposing walls converging toward the bottom thereof. Along the second wall's abutting surface there extends a tongue having a base, sides projecting from the base, and an end surface spaced from the base and intersecting both sides. The intersection of this end surface and sides defines corners parallel to each other and spaced from each other by a predetermined amount less than the predetermined width of the groove's mouth. The tongue and groove have relative dimensions and shapes allowing the tongue to enter the groove and mate therewith, with each corner of the tongue forming a line of contact with one of the groove's walls. Clamping means in mechanical connection with the walls force the tongue's corners against the groove's sides and cause deformation of at least one of the tongue and the groove along the lines of contact between the tongue's corners and the groove's walls.

This structure resists penetration by liquids in all situations except where the walls are actually immersed in the liquid.

BRIEF DESCRIPTION OF THE DRAWINGS

FIG. 1 is a perspective view of an enclosure having walls which carry the invention on the edges thereof.

FIG. 2 is a cross section of first and second walls adjacent to the abutting surfaces thereof when unmated.

FIG. 3 is a cross section of first and second walls adjacent to the abutting surfaces thereof when mated.

FIG. 4 is a blow-up of the cross section of first and second walls when mated and adjacent to a line of contact thereof between the tongue and the groove.

DESCRIPTION OF THE PREFERRED EMBODIMENT

Turn first to FIG. 1, which shows a simple rectangular box employing the invention and suitable for enclosing electronic circuitry or other apparatus which must be protected from fluids such as water. In this embodiment, the box has a top half 12 and a bottom half 11, each comprising a pair of mating walls 18 and 17 respectively, as well as other mating wall pairs and a top or bottom which have not been designated with reference numbers. Each wall 18 and 17 has respectively an abutting surface or surface 20 and 19. Each half 12 and 11 is formed from material which is substantially rigid. However, at least one of each pair of mating walls must be formed of material which is deformable under load. This deformable material may be either plastically or elastically deformable. One preferred type of material which is used for forming the entire box halves 12 and 11 is a nylon-based mineral-filled engineering plastic from which the box halves 12 and 11 may be formed by injection molding. Such material may be purchased commercially from Dupont Corporation, Wilmington, Del. under the trade name Minlon 10B.

Top and bottom halves 12 and 11 are held together by projections 14 and 13 respectively carried on walls 18 and 17 and integral therewith, although any type of clamping means may be used to force the abutting surface 20 of wall 18 against the corresponding abutting surface 19 of wall 17. Projections 14 and 13 have cylindrical bores therein which are coaxial with each other. Screw type fasteners 15 pass through the bores in projections 14 and engage the walls of the bores in the projections 13 to clamp box half 12 against box half 11, forcing surface 20 toward edge 19.

Turn next to FIGS. 2 and 3 where details of the abutting surfaces 20 and 19 are shown cross sectionally. The edge 20 includes a tongue 22 extending along the entire length of edge 20 as well as along the edges of the other walls of box half 12. The tongue 22 is defined by sides 28 and 29 shown in edge view in FIGS. 2 and 3 and projecting from a base portion 34 of abutting surface 20. An end 21 intersects the sides 28 and 29 and forms at these intersections, corners 36 and 37 which extend along the entire length of tongue 22. In the typical design, the cross section of tongue 22 and the adjacent abutting surface 20 is uniform along the entire length of tongue 22, so that sides 28 and 29 are parallel to each other. Corners 36 and 37 are not sharp, but have a radius of curvature of a few thousands of an inch, and in my preferred design, 0.010 in. (0.25 mm.). This is easy to achieve by standard injection molding techniques. Sides 28 and 29 are each inclined to a vertical centerline of FIG. 2 or 3 by a few degrees, and the preferred design has this angle at 10°. The width of end 21 in my preferred design is 0.031 in. (0.78 mm) and the total length of tongue 22 from end 21 to edge 20 is 0.06 in. (1.5 mm.).

The bottom half's abutting surface 19 includes a groove 27 extending the entire length of wall 17. Groove 27 is defined by opposing walls 23 and 25 which converge toward the bottom 24 of the groove 27. In a preferred embodiment, the cross section of groove 27 in the vicinity of the contact points of is circular, although other profile shapes are probably suitable. The width of groove 27 at edge 19 must be greater than the width of the tongue's end 21. The depth of groove 27 where its width equals that of the width of the tongue's end 21 must be less than the cross-sectional length of tongue 22 as it projects from wall 18. That is, there must be a clearance space between surfaces 19 and 20 when tongue 22 is in interference contact with groove 27. It is likely that a much wider range of angles will prove satisfactory for the inclination from the centerline of sides 28 and 29, than the 10° mentioned above.

The seal is formed by mating tongue 22 into groove 27 and applying sufficient force symbolized in FIG. 3 as the arrows labeled F, to cause some deformation of at least on of the tongue 22 and the groove 27. For the engineering plastic identified as suitable material from which to make the walls 17 and 18, screws 15 may be spaced from 3 to 3.5 in. (7.6 to 8.9 cm.) and torqued to 11 to 12 in. lb. (12.7 to 13.9 cm. kg.) to provide adequate joining force.

FIG. 4 shows in an idealized way how a corner of tongue 22 may distort under adequate joining force. Line 41 is tangent to the sides of groove 27 at the depth where the width of groove 27 equals the width of the tongue's end 21 and thus where the corners of tongue 22 contact the walls of groove 27. Line 41 makes an angle with the groove centerline 40 of around 55° to 60° in a preferred embodiment.

One can thus see that a seal between walls formed from nearly rigid materials according to this invention is strongly resistant to penetration by liquids, and is thus suitable for housing electronic equipment and other devices in environments subjected to damaging liquid sprays.

What I claim is:

1. An interface assembly for sealing, abutting surfaces of first and second walls, against penetration by fluids at least one wall is comprised of nearly rigid material which deforms under load, comprising in the first wall and extending along at least a portion of the abutting surface a groove having an opening of predetermined width and an interior surface having opposing walls converging toward the bottom thereof, and along the second wall's abutting surface a tongue having a base, sides projecting from the base, and an end surface spaced from the base and intersecting both sides, the intersection of said end surface and said sides defining corners spaced from each other by a predetermined amount less than the predetermined width of the groove's mouth, said tongue and groove having relative dimensions and shapes allowing the tongue to enter the groove and mate with non-surface contact therewith, with each corner of the tongue forming a line of contact with one of the groove's walls, and clamping means in mechanical connection with the walls for forcing the tongue's corners against the groove's sides and for causing deformation of at least one of the tongue and the groove along the lines of contact between the tongue's corners and the groove's walls.

2. The assembly of claim 1, wherein the sides and end of the tongue are each substantially flat surfaces.

3. The assembly of claim 2, wherein the clamping means comprises a projection on each of the first and second walls in alignment with each other and in each projection a cylindrical bore coaxial with the cylindrical bore in the other projection, and a cylindrical fastener in the two cylindrical bores for drawing the two walls toward each other.

4. The assembly of claim 3, wherein the projections are integral with their respective walls.

5. The assembly of claim 2, wherein the corners formed by the intersections of the sides and end of the tongue have a radius of curvature not greater than about 0.25 mm.

6. The assembly of claim 5, wherein the walls are formed of mineral-filled thermoplastic.

7. The assembly of claim 1 wherein the base of the groove between the lines of contact of the groove with the tongue has a radius of curvature substantially smaller than that of the end of the tongue.

8. The assembly of claim 1, wherein the cross section of each of the tongue and the groove is uniform along the length of the tongue and the groove.

9. The assembly of claim 8, wherein the cross section of each of the tongue and the groove is bilaterally symmetric.

10. The assembly of claim 1, wherein the cross section of the groove is circular in the vicinity of the lines of contact with the tongue.

11. The assembly of claim 10, wherein the dimensions of the tongue and groove cooperatively cause a clearance space to be formed between them when the tongue mates with the groove.

12. The assembly of claim 1, wherein the dimensions of the tongue and groove cooperatively cause a clearance space to be formed between them when the tongue mates with the groove.

* * * * *